United States Patent [19]

Nishimura

[11] Patent Number: 5,589,040

[45] Date of Patent: Dec. 31, 1996

[54] PROCESS FOR PRODUCING OPTICAL RECORDING MEDIUM SPUTTERING METHOD AND SPUTTERING TARGET

[75] Inventor: Naoki Nishimura, Tokyo, Japan

[73] Assignee: Canon Kabushiki Kaisha, Tokyo, Japan

[21] Appl. No.: 580,047

[22] Filed: Dec. 20, 1995

Related U.S. Application Data

[63] Continuation of Ser. No. 131,734, Oct. 5, 1993, abandoned.

[30] Foreign Application Priority Data

Oct. 5, 1992 [JP] Japan .................................. 4-288187
Aug. 26, 1993 [JP] Japan .................................. 5-211613

[51] Int. Cl.⁶ ................................................ C23C 14/34
[52] U.S. Cl. ................ 204/192.26; 204/192.15; 204/192.22; 204/192.23; 204/192.2
[58] Field of Search .................. 204/192.12, 192.15, 204/192.22, 192.16, 192.2, 192.23, 298.12, 298.13, 192.26

[56] References Cited

U.S. PATENT DOCUMENTS

| | | | |
|---|---|---|---|
| 3,630,881 | 12/1971 | Lester et al. | 204/298.12 X |
| 4,551,216 | 11/1985 | Argyo | 204/298.12 X |
| 4,834,856 | 5/1989 | Wehner | 204/298.12 X |
| 4,978,437 | 12/1990 | Wirz | 204/192.23 |
| 5,087,297 | 2/1992 | Poutiquen | 204/298.13 X |
| 5,091,267 | 2/1992 | Asano et al. | 204/192.23 X |
| 5,151,295 | 9/1992 | Kawahara et al. | 427/12 |

FOREIGN PATENT DOCUMENTS

| | | |
|---|---|---|
| 0165413 | 12/1985 | European Pat. Off. . |
| 4025231 | 1/1992 | Germany . |
| 62-137748 | 6/1987 | Japan . |
| 63-466 | 1/1988 | Japan . |
| 63-238269 | 10/1988 | Japan . |
| 2-15167 | 1/1990 | Japan . |
| 3126867 | 5/1991 | Japan . |
| WO92/01080 | 1/1992 | WIPO ..................... 204/298.13 |

OTHER PUBLICATIONS

G. Wehner, "Controlled . . . Ions", Physical Review, vol. 10, No. 3, May 1, 1956, pp. 690–704.

"Influence of Oxygen Content in Sputtering Targets on Co–Cr Film Properties", Tadokoro, et al., IEEE Translation Journal of Magnetics in Japan, vol. 4(1), Jan. 1989, pp. 32–38.

"Plasma assisted physcial vapor deposition processes: A review", Bunshah, et al., Journal of Vacuum Science & Technology, vol. 3(3), Part 1, May–Jun, 1985, pp. 553–560.

Patent Abstracts of Japan, vol. 13, No. 39 (C–563) (3387), Jan. 27, 1989.

Patent Abstracts of Japan, vol. 14, No. 146 (C–704) (4089), Mar. 20, 1990.

Patent Abstracts of Japan, vol. 11, No. 362 (P–640), Nov. 26, 1987.

(List continued on next page.)

Primary Examiner—Nam Nguyen
Attorney, Agent, or Firm—Fitzpatrick, Cella, Harper & Scinto

[57] ABSTRACT

An optical recording medium having on a substrate an optical recording film and an inorganic dielectric film containing a target element of a metal or metalloid, such as Si or Ge, is produced by forming the inorganic dielectric film by subjecting a sputtering target comprising a crystal of the target element to DC sputtering in a reactive gas atmosphere. Abnormal discharge leading to inferior products and a lower productivity is suppressed by constituting the sputtering target to have a sputtering surface conforming to a lattice plane of the crystal free from a void allowing intrusion of an atom, ion or radical originating from the reactive gas into the unit lattice. In case of an Si single crystal having a diamond structure, the sputtering surface is preferably conformed to a lattice plane represented by Miller indices (1,0,0) or (1,1,1). The sputtering target is preferably provided with a chamfer adjacent to the sputtering surface.

16 Claims, 8 Drawing Sheets

OTHER PUBLICATIONS

Patent Abstracts of Japan, vol. 12, No. 198 (C–502) (3045), Jun. 8, 1988.

Patent Abstracts of Japan, vol. 15, No. 332 (C–0861), Aug. 23, 1991.

Bloom, et al., "The Preparation of Large–Area Silicon Cathodes for Use in Reactive Sputtering", *Journal of the Electrochemical Society* (Oct. 1965), pp. 1050–1051.

Sze, *Physics of Semiconductor Devices*, 2nd Ed., (1981), p. 11.

Chapman, *Glow Discharge Processes* (1980), pp. 389–391, 393.

Serikawa, et al., "Effect of $N_2$–Ar Mixing on the Reactive Sputtering Characteristics of Silicon", *Thin Solid Films*, vol. 101, No. 1 (Mar. 1983), pp. 1–5.

PROCESS FOR PRODUCING OPTICAL RECORDING MEDIUM SPUTTERING METHOD AND SPUTTERING TARGET

This application is a continuation of application Ser. No. 08/131,734 filed Oct. 5, 1993, now abandoned.

FIELD OF THE INVENTION AND RELATED ART

The present invention relates to a process for producing an optical recording medium and a process for forming an inorganic dielectric film utilizing a sputtering method, and also to a sputtering target.

In recent years, there have been widely used optical recording media of a large capacity using laser light for data recording and data reading, such as optical disks and opto-magnetic disks.

For example, there has been known a structure of opto-magnetic disk as shown in FIG. 2, which comprises in sequence a substrate 21, a recording layer 22 including an inorganic dielectric film 23, an optomagnetic recording film 24 and an inorganic dielectric film 25, and also a resinous protective layer 26 on the recording layer 22. The inorganic dielectric films 23 and 25 in the recording layer 22 function as a protective film for preventing corrosion of the opto-magnetic recording film and an interference film for Kerr effect enhancement, and may for example comprise a film of $SiN_x$ or a film of $SiO_x$.

In order to form a dielectric film on a substrate, there has been conventionally used a method of sputtering a target of a dielectric having substantially the same composition as the dielectric film to be formed by high-frequency discharge in an Ar gas atmosphere. Such high-frequency sputtering of a dielectric target is liable to apply heat to the substrate, so that the substrate is liable to warp and the resultant film is liable to show poor adhesion. This problem is pronounced where a higher film formation speed is adopted in order to improve productivity.

In contrast thereto, there has been recently used a so-called DC reactive sputtering method, wherein a target comprising a metal or metalloid element constituting the dielectric film is sputtered in an Ar gas while applying a DC potential to the target, and introducing a reactive gas comprising the remaining element to cause reaction with the metal or metalloid element to form a dielectric film on a substrate. More specifically, an inorganic dielectric film of $SiN_x$, for example, may be formed according to the DC reactive sputtering method by using a target of Si and a reactive gas of $N_2$ or $NH_3$. Compared with the high-frequency sputtering method, the DC reactive sputtering method provides a higher film forming speed and allows film formation on the substrate at a lower temperature, thus providing excellent productivity.

The DC reactive sputtering method involves a problem in that it is liable to cause abnormal discharge, i.e., arc discharge which is a different form of discharge from stable discharge (glow discharge) during the sputtering step. If the abnormal discharge occurs during the sputtering step, the discharge becomes unstable while causing sparks to result in difficulties such that the film formed on the substrate has uneven thicknesses and film qualities and is accompanied with defects due to scattering of melted substance at the target surface due to the occurrence of the abnormal discharge. Such defects lead to defects in the resultant optical recording medium, so that the abnormal discharge is a serious problem in production of a high-quality optical recording medium.

In order to solve the abnormal discharge problem, Japanese Laid-Open Patent Application (JP-A) 3-126867, for example, has proposed a sputtering method of using a sputtering target having a non-erosion region comprising a material (e.g., Ti) which provides a compound film with an electroconductivity in the sputtering step so as to prevent dielectric breakdown. This method is based on a premise that the abnormal discharge in the DC reactive sputtering method generally effected by using a DC magnetron sputtering apparatus (i.e., a magnetron sputtering apparatus using a DC magnetron electrode wherein a permanent magnet is disposed on the backside of a target so as to cause a perpendicular magnetic field at the target surface, thereby causing discharge concentratively at a local region (erosion region) where an electric field and the magnetic field intersect each other at right angles, thereby increasing the sputter etching speed at the target surface) is caused by dielectric breakdown of an insulating inorganic dielectric (Si-based) formed in a region (non-erosion region) on the Si substrate where sputter etching does not proceed.

In addition to the above, it has been also proposed to coat the non-erosion region of a target with a thick insulating film not causing dielectric breakdown and to move the magnet on the back of the target so as to remove the non-erosion region, as a measure to prevent the abnormal discharge. Such measures are actually effective for lowering the frequency of abnormal discharge or the rate of occurrence of inferior optical recording media but are still not sufficiently effective for suppressing the abnormal discharge in the case of continuous sputtering of a single target for a long time by using, e.g., an in-line sputtering apparatus for increasing the productivity or increasing the power density applied to the target for the purpose of high-speed film formation. Accordingly, there has been desired a sputtering method capable of further reducing the occurrence of abnormal discharge even in such cases.

SUMMARY OF THE INVENTION

In view of the above-mentioned problems, an object of the present invention is to provide a process capable of producing a high-quality optical recording medium with few defects in the recording layer at a good productivity.

Another object of the present invention is to provide a sputtering method wherein the frequency of abnormal discharge is suppressed to provide high-quality inorganic dielectric films at a good productivity.

A further object of the present invention is to provide a sputtering target by which the occurrence of abnormal discharge is effectively suppressed in the case of DC sputtering for a long time or DC sputtering at a high power density.

According to our study in various respects, we have had the knowledge that an insulating inorganic dielectric is formed also at a sputtering region (erosion region) of a target where an insulating inorganic dielectric has been considered to be not formed because sputter etching is caused by inert gas (Ar, etc.) in the sputtering step, and the insulating inorganic dielectric formed at the erosion region also causes abnormal discharge.

According to the present invention accomplished based on the above knowledge, there is provided a process for producing an optical recording medium comprising on a substrate an optical recording film and inorganic dielectric film containing a target element comprising at least one of a metal element and a metalloid element, comprising:

an optical recording film-forming step of forming the optical recording film on the substrate, and an inorganic dielectric film-forming step of subjecting at least one sputtering target comprising a crystal of the target element to DC sputtering in a reactive gas atmosphere to form the inorganic dielectric film, wherein said crystal of the target element has a crystal structure having a unit lattice, a lattice plane including a void allowing intrusion of an atom, ion or radical originating from the reactive gas into the unit lattice and a lattice plane free from such a void allowing intrusion of an atom, ion or radical originating from the reactive gas into the unit lattice, and the sputtering target is so constituted to have a sputtering surface preventing formation of an inorganic dielectric thereon during the inorganic dielectric film-forming step.

According to another aspect of the present invention, there is provided a process for producing an optical recording medium comprising on a substrate an optical recording film and inorganic dielectric film containing a target element comprising at least one of a metal element and a metalloid element, comprising:

an optical recording film-forming step of forming the optical recording film on the substrate, and an inorganic dielectric film-forming step of subjecting at least one sputtering target comprising a crystal of the target element to DC sputtering in a reactive gas atmosphere to form the inorganic dielectric film, wherein said crystal of the target element has a crystal structure having a unit lattice, a lattice plane including a void allowing intrusion of an atom, ion or radical originating from the reactive gas into the unit lattice and a lattice plane free from such a void allowing intrusion of an atom, ion or radical originating from the reactive gas into the unit lattice, and the sputtering target is so constituted to have a sputtering surface substantially conforming to the lattice plane free from a void allowing intrusion of an atom, ion or radical originating from the reactive gas into the unit lattice.

According to another aspect of the present invention, there is provided a process for producing an optical recording medium comprising on a substrate an optical recording film and inorganic dielectric film containing a metalloid element, comprising:

an optical recording film-forming step of forming the optical recording film on the substrate, and an inorganic dielectric film-forming step of subjecting at least one sputtering target comprising a crystal of the metalloid element to DC sputtering in a reactive gas atmosphere to form the inorganic dielectric film, wherein said crystal of the metalloid element has a diamond crystal structure, and the sputtering target is so constituted to have a sputtering surface substantially conforming to a lattice plane represented by Miller indices (1,0,0) or (1,1,1) of the diamond crystal structure.

According to another aspect of the present invention, there is provided a process for producing an optical recording medium comprising a recording layer on a substrate, comprising: subjecting a sputtering target to DC sputtering to form the recording layer on the substrate, wherein the sputtering target comprises at least one flat surface constituting a sputtering surface and a chamfer adjacent to the flat surface.

According to another aspect of the present invention, there is provided a sputtering method for forming a film containing a target element comprising at least one of a metal element and a metalloid element, comprising:

providing at least one sputtering target comprising a crystal of the target element, and subjecting the sputtering target to DC sputtering in a reactive gas atmosphere to form the inorganic dielectric film, wherein said crystal of the target element has a crystal structure having a unit lattice, a lattice plane including a void allowing intrusion of an atom, ion or radical originating from the reactive gas into the unit lattice and a lattice plane free from such a void allowing intrusion of an atom, ion or radical originating from the reactive gas into the reactive gas, and the sputtering target is so constituted to have a sputtering surface substantially conforming to the lattice plane free from a void allowing intrusion of an atom, ion or radical originating from the reactive gas into the unit lattice.

According to another aspect of the present invention, there is provided a sputtering method, comprising: subjecting a sputtering target to DC sputtering to form a film, wherein the sputtering target comprises at least one flat surface constituting a sputtering surface and a chamfer adjacent to the flat surface.

According to another aspect of the present invention, there is provided a sputtering target, comprising: a crystal having a diamond crystal structure and a sputtering surface substantially conforming to a lattice plane represented by Miller indices (1,0,0) or (1,1,1) of the diamond crystal structure.

According to another aspect of the present invention, there is provided a sputtering target, comprising: a crystal of a metal or a metalloid element, said crystal having a unit lattice, a lattice plane including a void allowing intrusion of an oxygen atom, oxygen ion or oxygen radical into the unit lattice, and a lattice plane free from such a void allowing intrusion of an oxygen atom, oxygen ion or oxygen radical into the unit lattice, the sputtering target having so constituted to have a sputtering surface substantially conforming to the lattice plane free from such a void allowing intrusion of an oxygen atom, oxygen ion or oxygen radical into the unit lattice.

According to another aspect of the present invention, there is provided a sputtering target, comprising: a crystal of a metal or a metalloid element, said crystal having a unit lattice, a lattice plane including a void allowing intrusion of a nitrogen atom, nitrogen ion or nitrogen radical into the unit lattice, and a lattice plane free from such a void allowing intrusion of a nitrogen atom., nitrogen ion or nitrogen radical into the unit lattice, the sputtering target having so constituted to have a sputtering surface substantially conforming to the lattice plane free from such a void allowing intrusion of a nitrogen atom, nitrogen ion or nitrogen radical into the unit lattice.

According to another aspect of the present invention, there is provided a sputtering target, comprising: a crystal of a metal or a metalloid element, said crystal having a unit lattice, a lattice plane including a void allowing intrusion of a carbon atom, carbon ion or carbon radical into the unit lattice, and a lattice plane free from such a void allowing intrusion of a carbon atom, carbon ion or carbon radical into the unit lattice, the sputtering target having so constituted to have a sputtering surface substantially conforming to the lattice plane free from such a void allowing intrusion of a carbon atom, carbon ion or carbon radical into the unit lattice.

According to another aspect of the present invention, there is provided a sputtering target, comprising: a structure having at least one flat surface constituting a sputtering surface and a chamfer adjacent to the flat surface.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1:
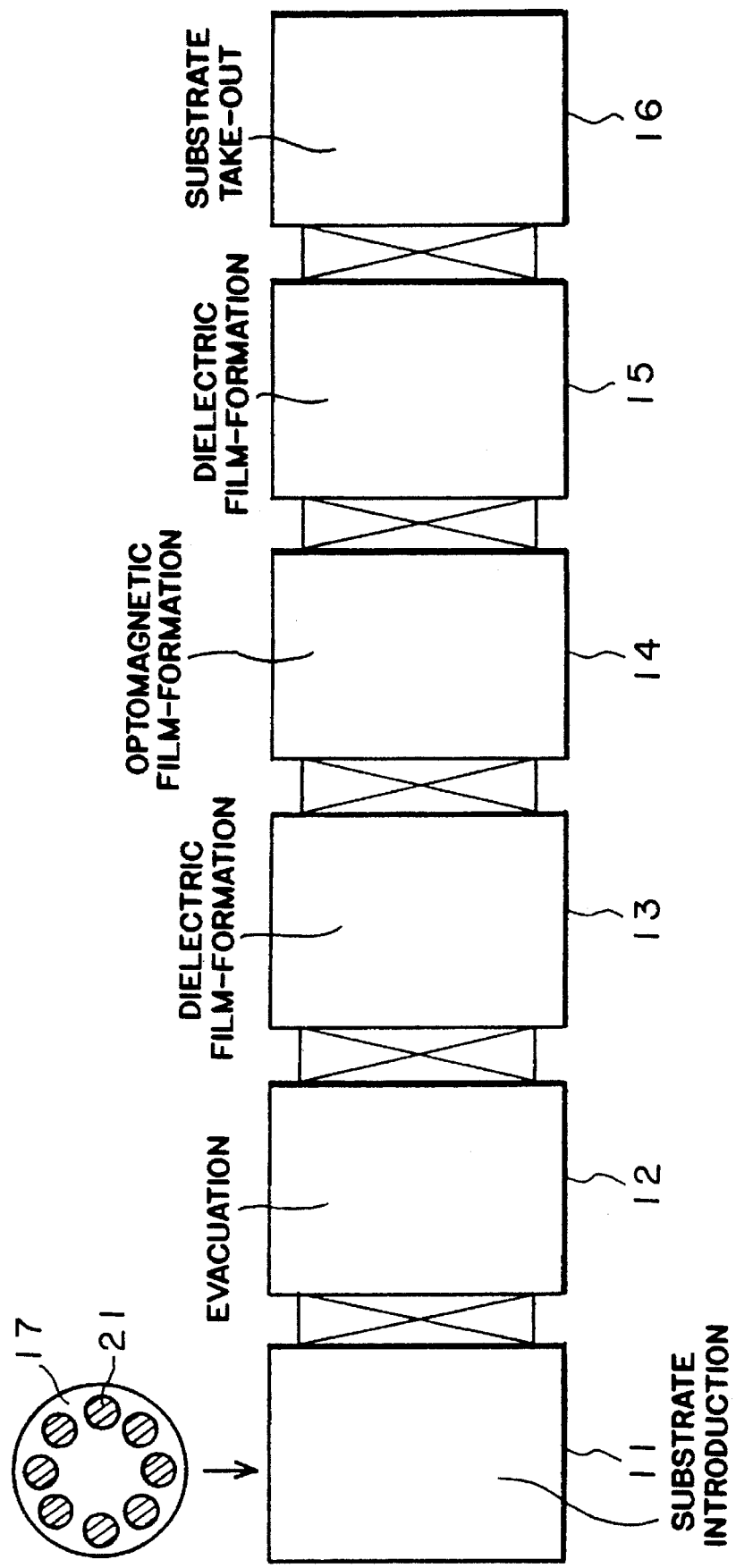
FIG. 1 is an illustration of a block plan arrangement of an in-line type recording layer film-forming apparatus applicable to an embodiment of the process for producing an optical recording medium according to the invention.
Figure 2:
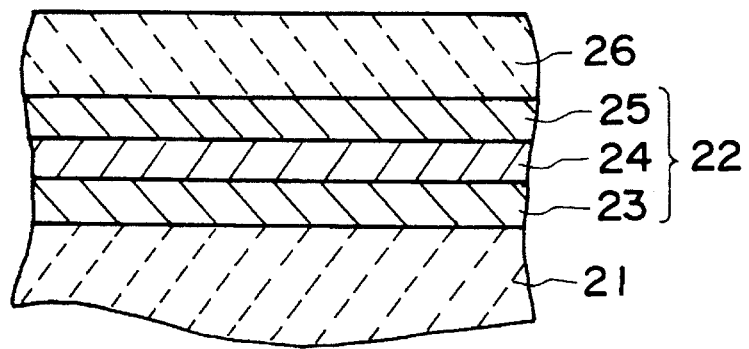
FIG. 2 is a schematic sectional view of a typical optomagnetic recording medium.

FIG. 1 illustrates a block plan arrangement of an in-line type sputtering apparatus for forming films in a recording layer applicable to an embodiment of the process for forming an optical recording medium as shown in FIG. 2 according to the present invention. Referring to FIG. 1, the sputtering apparatus includes a substrate introducing chamber 11, an evacuation chamber 12, chambers 13 and 15 for forming inorganic dielectric films 23 and 25, a chamber 14 for forming an optomagnetic recording film 24, and a chamber 16 for taking out a substrate 21 provided with a recording layer 22. Between the respective chambers, there are disposed shutters (not shown) which are opened and closed as desired, and a substrate holder 17 for supporting substrates 21 introduced into the chamber 11 is successively moved to the substrate take-out chamber 16.

Each substrate 21 for an optical recording medium is thus conveyed through the chambers 11–16 while being subjected to evacuation, formation of the inorganic dielectric film 23, formation of the optical recording film 24 and formation of the inorganic dielectric film 25 in the respective chambers to form an optical recording medium having the recording layer on the substrate 21.

Figure 3:
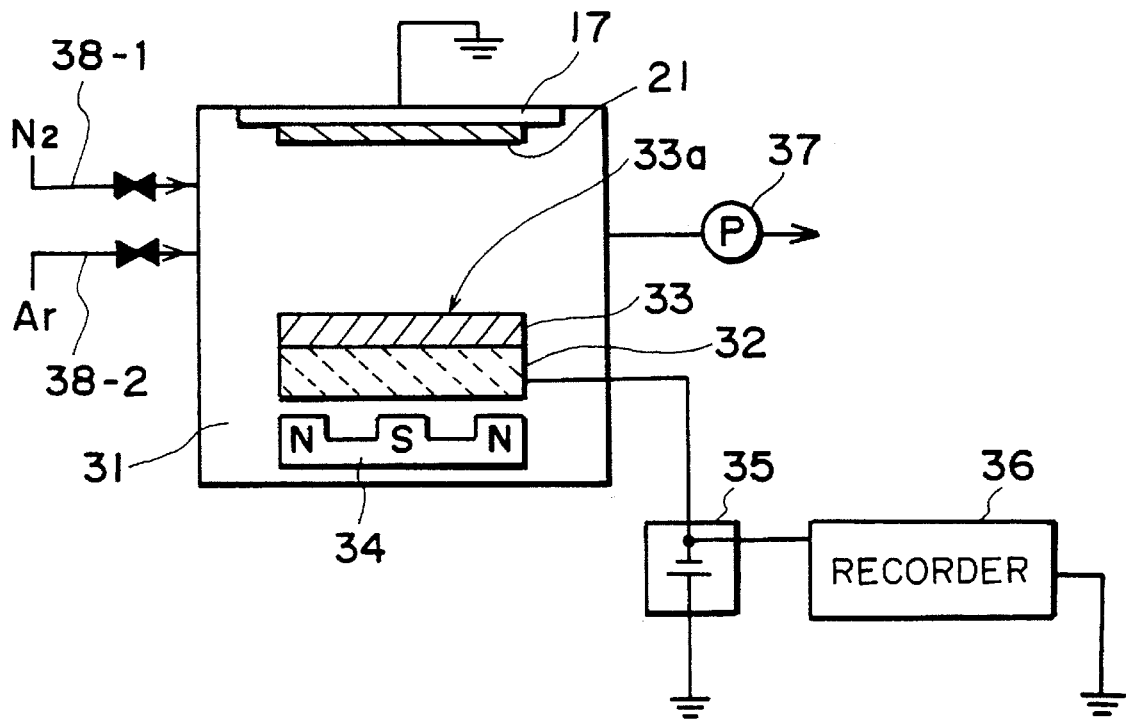
FIG. 3 is an illustration of a schematic sectional arrangement of the inorganic dielectric film-forming chamber within the recording layer film-forming apparatus shown in FIG. 1.

FIG. 3 is a view of a section in a direction perpendicular to the substrate movement of a film-forming chamber 13 or 15 for forming the inorganic dielectric film 23 or 25 in the film-forming apparatus shown in FIG. 1. As shown in FIG. 3, within the chamber 31 of the film-forming chamber 13 or 15, there is disposed a backing plate 32 functioning as a cathode and made of, e.g., copper, near the bottom of the chamber, and a target 33 is disposed on the backing plate 32. The backing plate 32 is connected to a DC power supply 35 so as to provide a prescribed sputtering power to the target 33. Above the target 32 is disposed a substrate 21 held by a substrate holder 17 also functioning as an anode so as to confront the target 33. A permanent magnet 34 in a disk-shape including a cylindrical central magnetic pole (S-pole) and an annular peripheral magnetic pole (N-pole) is disposed below the backing plate 32 so that a magnetic field generated thereby on a sputtering surface 33a confronting the substrate 21 of the target 33 is substantially perpendicular to an electric field created by the backing plate 32 and the substrate holder 17, and the permanent magnet 34 is disposed movable by an unshown means so as to develop an erosion region substantially entirely on the sputtering surface 33a, i.e., so as not to form a non-erosion region. To the DC power supply 35 is connected a recorder 36 for recording a current flowing through and a voltage applied to the target 33 during the sputtering step.

In operation, an $SiN_x$ film, for example, may be formed by using a target 33 of Si. The chamber 31 is evacuated to vacuum by a vacuum pump 37, and then a discharge gas of, e.g., Ar, is introduced through a pipe 38-2 and a reactive gas of, e.g., $N_2$, $NH_3$ or a mixture thereof, is introduced through a pipe 38-1. Further, a sputtering power is applied to the target 33, whereby the sputtering surface 33a is sputtered to evolve Si atoms, which are then reacted with the reactive gas to form an $SiN_x$ film on the substrate 21.

According to a first characteristic of the present invention, there is provided a sputtering target so constituted as to be free from formation of an inorganic dielectric in the erosion region of the sputtering surface 33a even after the inorganic dielectric film-forming step. As a result, the frequency of abnormal discharge can be effectively decreased even in long-time sputtering or high-power density sputtering, thus providing a high-quality inorganic dielectric film at a good productivity.

A sputtering target satisfying the above-mentioned characteristic feature of, e.g., Si crystal, may be provided by substantially conforming a lattice plane thereof substantially free from voids allowing intrusion of an atom, ion or radical originating from the reactive gas to the sputtering surface 33a. More specifically, in the case of using a reactive gas of, e.g., $N_2$, $NH_3$, $O_2$ or $C_2H_2$, which has been generally used for forming a dielectric film of $SiN_x$, $SiO_x$ or $SiC$ suitably used as a functional film within a recording layer of an optical recording medium by the reactive sputtering method, the formation of an inorganic dielectric in the erosion region of an Si target during the sputtering step if the sputtering surface 33a of the Si target is disposed so as to substantially conform to a lattice plane of Si crystal represented by Miller indices (1,0,0) or (1,1,1).

Figure 4:
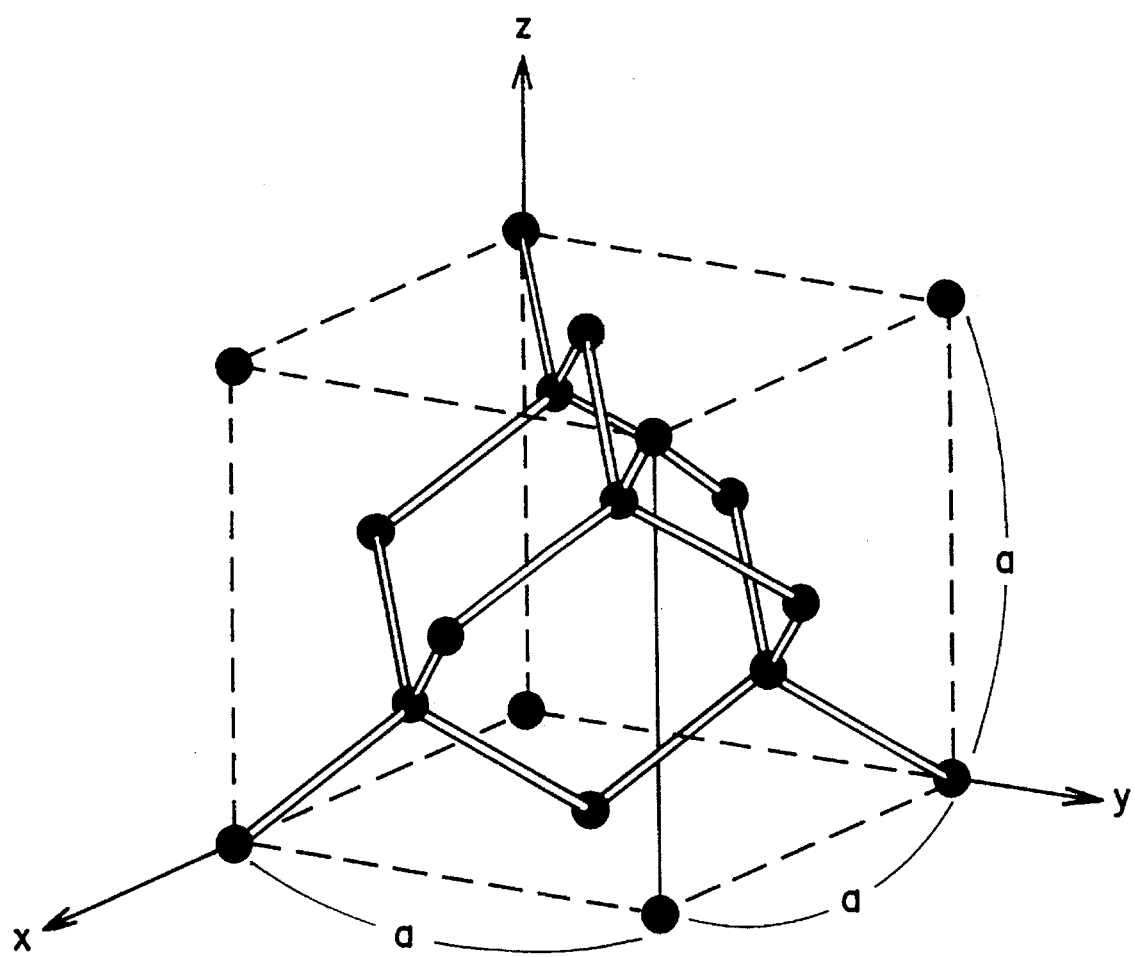
FIG. 4 is a schematic illustration of a diamond crystal structure.
Figure 5:
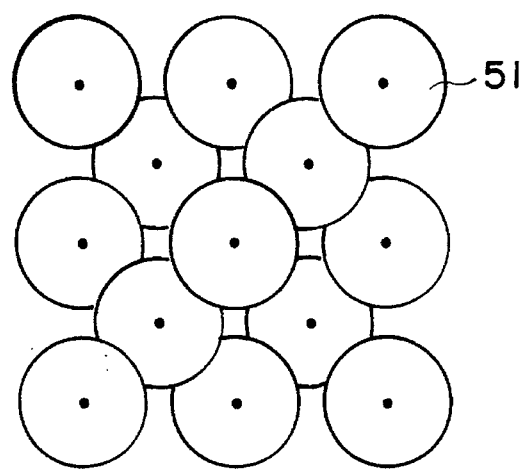
FIG. 5 is a sectional view on a lattice plane represented by Miller indices (1,0,0) of Si crystal having a diamond structure.
Figure 6:
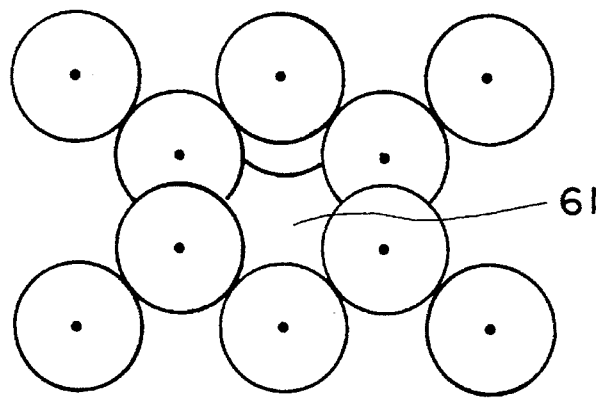
FIG. 6 is a sectional view on a lattice plane represented by Miller indices (1,1,0) of Si crystal having a diamond structure.
Figure 7:
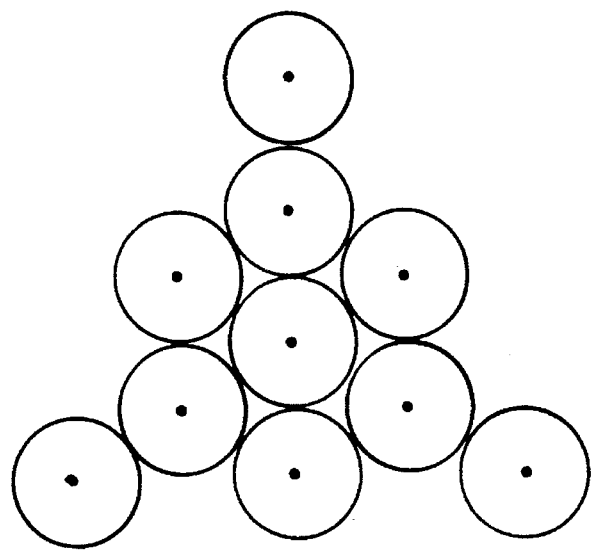
FIG. 7 is a sectional view on a lattice plane represented by Miller indices (1,1,1) of Si crystal having a diamond structure.

Si crystal has a diamond structure as shown in FIG. 4 including lattice planes represented by Miller indices (1,0,0), (1,1,0) and (1,1,1) illustrated in FIGS. 5, 6 and 7, respectively, wherein each Si atom is represented by a circle 51 depicted in a size corresponding to an Si atomic radius (covalent bond radius=1.17 Å) in proportion to a unit lattice length (a=5.4301 Å). Among these figures, FIG. 6 shows that the lattice plane represented by Miller indices (1,1,0) includes a void 61 in a diameter of about 1.6 Å among Si atoms communicating with the interior of the unit lattice.

On the other hand, in case of using a reactive gas of $N_2$, $NH_3$, $O_2$ or $C_2H_2$ generally used for formation of an Si-based dielectric film of $SiN_x$, $SiO_x$ or $SiC$, there may be included, e.g., N, $N^{5+}$, C, $C^{4+}$ and O as an atom or ion originating from the reaction gas and capable of forming an insulating dielectric on the sputtering surface of a target. The diameter sizes are, for example, about 1.06 for N, about 0.5 Å for $N^{5+}$, 1.54 Å for C, about 0.12 Å for $C^{4+}$ and about 1.32Å for O. As a result, the lattice plane represented by Miller indices (1,1,0) of Si retains voids capable of taking in such ions or atoms originating from the above-described reactive gases as interstitial atoms.

In contrast thereto, in the lattice planes represented by Miller indices (1,0,0) and (1,1,1) as shown in FIGS. 5 and 7, Si atoms are present in proximity with each other without forming such voids capable of introducing ions, atoms or radicals originating from reactive gases as described above in the sputtering step. In the present invention, the sputtering surface 33a may preferably formed so as to conform to the lattice plane represented by Miler indices (1,0,0) or (1,1,1), whereby the frequency of abnormal discharge can be remarkably reduced even in case of continuous sputtering for a long time or sputtering at a-high power density and the occurrence of inferior optical recording media can be effectively suppressed.

The above-constituted sputtering target may be considered effective because an insulating dielectric is not readily formed on the sputtering surface of the target due to introduction of the atoms, ions or radicals originating from the reactive gas even by impingement with the atoms, etc. during continuous sputtering for long time or sputtering at a high power density, and dielectric breakdown due to such an inorganic dielectric can be prevented.

In this embodiment, the Si target may preferably comprise a single crystal so as to easily have the sputtering surface conform to the lattice plane with Miller indices (1,0,0) or (1,1,1) and substantially remove the presence of voids at the sputtering surface.

The above embodiment has been explained with Si as the target material. It is also possible to use an element, such as Ge (germanium) or Sn (tin), which has a diamond structure similar to Si and is capable of forming an insulating dielectric film suitable as a function film for an optical recording medium by DC sputtering thereof in the presence of various reactive gases as described above as a material for constituting a sputtering target having a sputtering surface conforming to the lattice plane with Miller indices (1,0,0) or (1,1,1).

Further, the target-constituting element used in the present invention is not restricted to one having a diamond crystal structure but may be any element which can form an insulating dielectric film effective as a functional film of an optical recording medium by DC reactive sputtering. In connection with the kind of a reactive gas, the present invention is particularly effectively applicable to a type of element which provides a crystal structure including a lattice plane having voids allowing the intrusion of some of the atoms or ions originating from the reactive gas and also a lattice plane free from voids which allow the intrusion of the smallest one of the atoms or ions originating from the reactive gas.

Incidentally, the expression of "the sputtering surface substantially conforming to a lattice plane free from voids allowing intrusion of the smallest one of the atoms, ions or radicals originating from the reactive gas into the unit lattice" is intended to mean not only the case where the sputtering surface completely conforms to the lattice plane but also the case where the sputtering surface conforms to the lattice plane with some deviation therefrom within an extent that the sputtering surface does not lose the characteristic of the lattice plane of not allowing the intrusion the atoms, ions or radicals originating from the reactive gas into the unit lattice.

Next, the formation of an inorganic dielectric film in the present invention will be described. The conditions for forming an inorganic dielectric film may be appropriately selected so as to provide the inorganic dielectric film with a tightness required of a protective film for an optical recording film and/or optical properties required of an interference layer, and can vary depending on the function required of the inorganic dielectric film and the material constituting the inorganic dielectric film. For example, however, in the case of forming an $SiN_x$ film as a protective film and interference film suitable for use in combination with an optomagnetic recording medium of, e.g., Tb—Fe—Co, it is preferred to select film-forming conditions such that the resultant $SiN_x$ film shows a compression stress of 0–30 kg.f/cm$^2$ and a refractive index of about 2.0–2.3. More specifically, preferred conditions may include a discharge power of 1–10 W/cm$^2$, a total pressure of discharge gas and reactive gas of 0.1–0.8 Pa, and a content of the reactive gas in the mixture of the discharge gas and the reactive gas of 10–50% so as to provide the resultant $SiN_x$ film with the above properties.

The thickness of the inorganic dielectric film may be determined depending on the structure of the recording layer and the required properties of the inorganic dielectric film. For example, however, in case of a recording layer structure 22 as shown in FIG. 2 including two inorganic dielectric film layers 23 and 25 disposed to sandwich an optical recording film 24, the thickness may preferably be about 100–1500 Å for the inorganic dielectric film 23 between the substrate 21 and the optical recording film 24 and about 100–1000 Å for the inorganic dielectric film 25 on the optical recording film 24 so as to effectively protect the recording film and enhance the Kerr rotation angle at the time of signal reproduction.

Figure 8A:
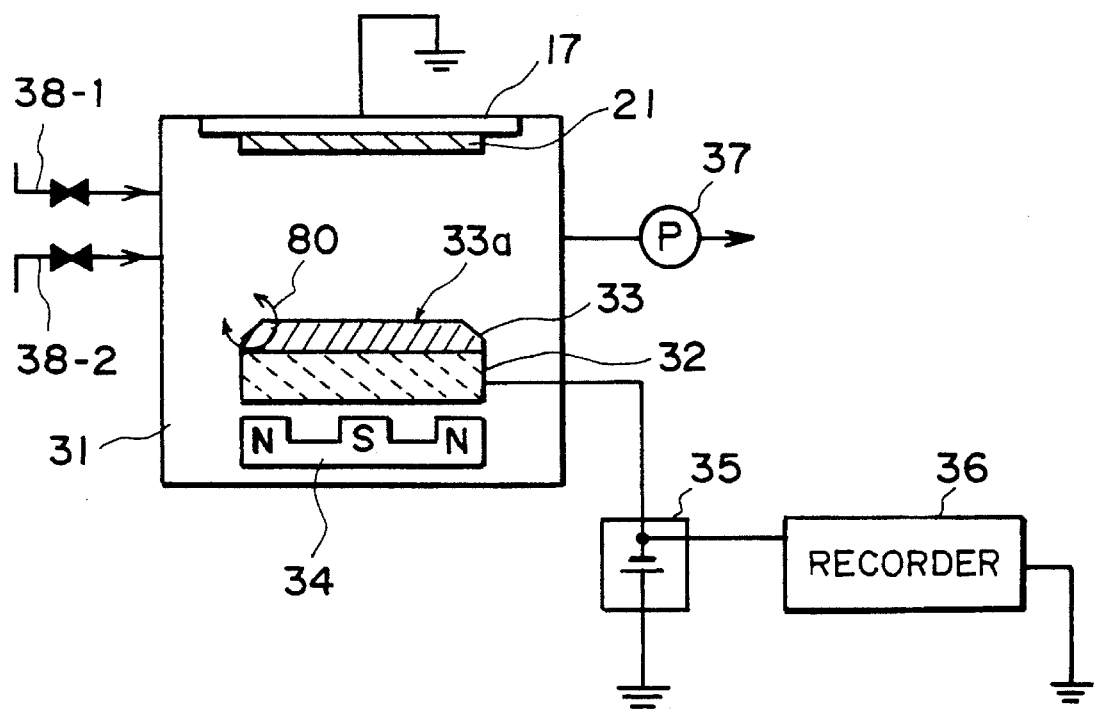
FIG. 8A is an illustration of a schematic sectional arrangement of an inorganic dielectric film-forming chamber within a recording layer forming apparatus according to another embodiment of the process for producing an optical recording medium according to the invention.
Figure 8B:
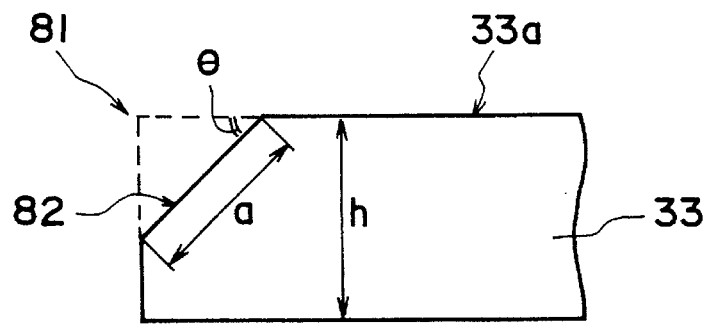
FIG. 8B is an enlarged sectional view of a sputtering target shown in FIG. 8A.

A second characteristic of the present invention is to use a chamfered sputtering target 33 as shown in FIG. 8A formed by chamfering an edge/corner 81 adjacent to the sputtering surface 33a as shown in FIG. 8B which is an enlarged view of a part 80 in FIG. 8A. Such a chamfered target is effective in suppressing charge concentration at the target edge during sputtering and reducing the frequency of abnormal discharge between the target edge and the plasma space.

In the present invention, it is preferred to chamfer the sputtering target so as to provide a chamfered target having a section as shown in FIG. 8B passing through the center of the target 33 and intersecting the sputtering surface 33a at right angles, including a thickness h and a chamfer 82 forming an angle θ with respect to the sputtering surface 33a of 20–60 degrees, further preferably 40–50 degrees, particularly preferably 43–47 degrees, and having a length a which satisfies a relationship of $a \cdot \sin\theta/h = 0.2$–$0.8$, particularly 0.3–0.7 for the purpose of effectively preventing the occurrence of a crack in the target during sputtering without substantially lowering the sputtering efficiency of the target.

The shape of a sputtering target may be a circular disk or a rectangular plate. In any case, it is preferred to chamfer the whole edge(s)/corner(s) adjacent to and surrounding the sputtering surface.

The reason for the effectiveness of such a chamfered target has not been fully clarified as yet but may be considered as follows. A target during sputtering is subjected to heating on the sputtering surface while being cooled on the opposite surface in contact with a backing plate, so that the target is supplied with a compression force on the sputtering surface side and a tensile stress on the opposite side. As a result, a shearing stress occurs in a direction of almost 45 degrees with respect to the sputtering surface and is concentrated at the target edge to cause a crack within the target. If a chamfered target having a chamfer 82 adjacent to sputtering surface 33a, the concentration of the abovementioned shearing force can be relaxed, so that the occurrence of a crack in or breakage of the target can be prevented.

Figure 9:
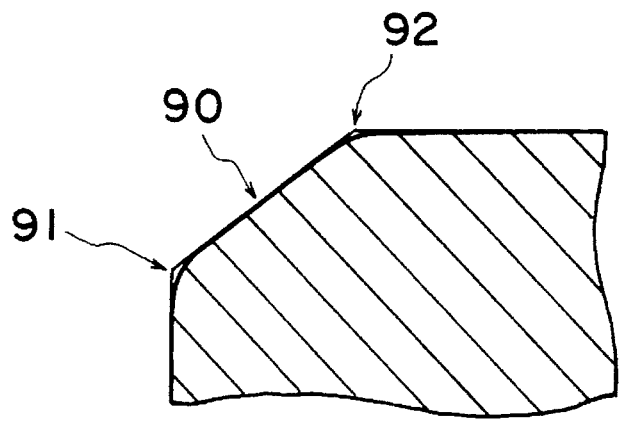
FIG. 9 is an enlarged sectional view of another embodiment of the sputtering target according to the invention.

In the present invention, it is preferred that edges/corners 91 and 92 newly formed adjacent to a chamfer 90 by chamfering as illustrated in FIG. 8 are subjected to further chamfering or rounding as illustrated in FIG. 9 as it is effective for further suppressing the occurrence of abnormal discharge.

Figure 10:
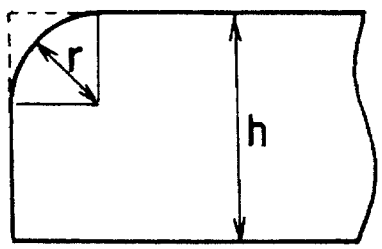
FIG. 10 is an enlarged sectional view of still another embodiment of the sputtering target according to the invention.

As another mode of chamfering it is also possible to round an edge/corner of the target to form a curved chamfer as shown in FIG. 10. In this case, the curved chamfer may preferably have a curvature radius r satisfying $h/10 \leq r \leq h$, particularly $h/5 \leq r \leq h/2$ so as to effectively suppress the occurrence of abnormal discharge and cracking within the target without substantially lowering the sputtering efficiency of the target.

The sputtering target to which the chamfering is effectively applied may comprise any target material having an electroconductivity suitable for DC sputtering, examples of which may include: metals, such as Al, Ti, Co, Mn, Fe, Cr, Ni, Cu, Ta, Pt, Tb, Ga, Nd, Zn, Zr, Mo, Ru, Rh, Pd, Ag, Hf and Ir, and metalloids or non-metals, such as Si, Ge, Se, Te and C optionally doped with B (boron), P (phosphorous), etc. The chamfered sputtering target may show an effect of suppressing abnormal discharge not only in the DC reactive sputtering but also in ordinary DC sputtering.

The combination of the first and second characteristics of the present invention may provide a sputtering target which shows a better effect of suppressing abnormal discharge than that shown by a sputtering target satisfying only the first characteristic of the present invention.

A sputtering target satisfying the first characteristic and/or the second characteristic, when composed of an insulating material, such as Si or Ge, not showing an electroconductivity required for DC sputtering in the form of a simple substance, has to be doped with a conductivity-imparting substance, such as B (boron) or P (phosphorus), so as to provide an electroconductive sputtering surface. In this case, the doping may preferably be effected to such an extent as to provide the target with a specific resistance of at most 0.01 Ω.cm, particularly at most 0.001 Ω.cm, so as to alleviate charge accumulation on the sputtering surface and further effectively suppress the occurrence of abnormal discharge.

On the other hand, the doping applied to a naturally insulating sputtering target may preferably be suppressed to such an extent that the resultant sputtering target retains a specific resistance of at least $10^{-5}$ Ω.cm, particularly at least $10^{-4}$ Ω.cm so as to substantially prevent the contamination of the resultant inorganic dielectric film with the conductivity-imparting substance.

It is further preferred in the present invention, as shown in FIG. 3, that at least of the sputtering target 33 and the backing plate 32 loaded with the sputtering target is formed in a shape and a size controlled so that the backing plate 32 and the sputtering target 33 mounted thereon have mutually conforming sides within the sputtering apparatus, whereby charge concentration leading to abnormal discharge caused at edges or corners (101 and 102 in FIG. 11) on the side opposite to the sputtering surface (103a) of the sputtering target (103) is suppressed by apparently or effectively removing the edges/corners, thus further effectively suppressing the cracking in the sputtering target.

Figure 11:
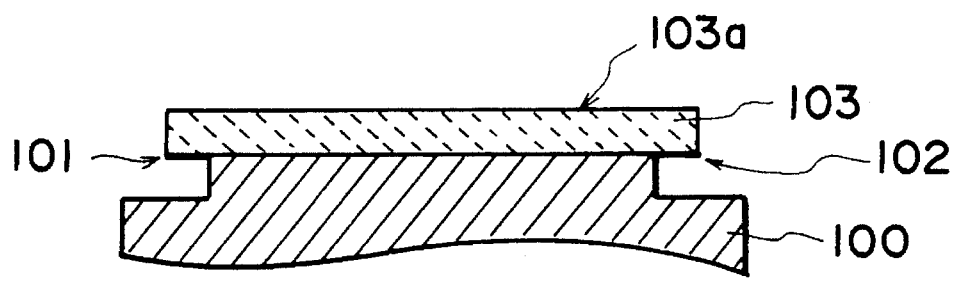
FIG. 11 is a sectional illustration of sizes of a sputtering target and a backing plate.

On the other hand, in case where the sputtering target 103 is disposed to protrude out of the backing plate 100 as shown in FIG. 11, a portion of the sputtering target 103 not contacting the backing plate 100 is less cooled than the other portion so that a thermal stress is caused by a temperature gradient in a direction parallel to the sputtering surface 103a of the target, thus causing a crack in the sputtering target.

If the sputtering target and the backing plates are so sized as to have mutually conforming sides as described above according to the present invention, no temperature gradient is caused in a direction parallel to the sputtering surface of the target, thus suppressing the occurrence of a crack in the sputtering target. In the process for producing an optical recording medium according to the present invention is principally characterized by the step of forming an inorganic dielectric film as described above, and the other features need not be particularly restricted. For example, the inorganic dielectric film and the optical recording film may be formed successively in an order as desired according to a prescribed recording layer structure.

The optical recording film may be formed by a known film-forming method appropriately selected depending on the characteristics of a material constituting the optical recording film, e.g., by vacuum evaporation, sputtering or wet-application.

The optical recording film may be of any type if it allows recording and reproduction of data by irradiation with light beam. Suitable examples thereof may include an optomagnetic recording film of, e.g., Tb—Fe—Co, Gd—Fe—Co, Tb—Fe—Co—b Cr or Gd—Fe—Co—Cr for which the protection of the optical recording film and/or the enhancement of reproduced signals from the optical recording film may suitably be effected in combination with an inorganic dielectric film, and an optical recording film comprising, e.g., spiropyran, and capable of recording by the photon mode which strictly requires a defect-free inorganic dielectric film, as these types of optical recording medium may more effectively enjoy the benefits of the process for producing an optical recording medium according to the present invention.

The optical recording medium comprising a substrate and a recording layer thereon formed by the process according to the present invention may be further coated with a reflection layer and/or a protective layer. In this case, the reflection layer may comprise, e.g., Au or Al and may be formed by, e.g., evaporation or sputtering. The protective layer may be formed by coating the recording layer with a photocurable resin in a thickness of, e.g., 10–30 μm and photocuring the coating, or applying a prescribed thickness of resin sheet (of, e.g., polycarbonate resin or polyester resin) with an adhesive, a pressure-sensitive adhesive, etc.

As described above, the present invention is based on a novel knowledge that, in the case of forming an inorganic dielectric film by the DC reactive sputtering method, an insulating inorganic dielectric is formed even on an erosion region of a sputtering surface of a sputtering target where no inorganic dielectric has been believed to be formed because sputter etching is caused by an inert gas, and the inorganic dielectric formed in the erosion region causes abnormal discharge. According to the present invention, in producing an optical recording medium comprising a recording layer including an inorganic dielectric film formed by the DC reactive sputtering, the abnormal discharge can be remarkably reduced even in continuous sputtering for a long time using a single target and/or sputtering at a high power density, thereby providing high-quality optical recording media at a good productivity.

Further, according to the present invention, in film-formation according the DC sputtering inclusive of the DC reactive sputtering, the abnormal discharge as well as the occurrence of a crack in or breakage of the target causing the abnormal discharge can be effectively suppressed even in sputtering for a long time using a single target continuously and/or sputtering at a high power density.

Hereinbelow, the present invention will be described in further detail based on Examples.

EXAMPLE 1

An optomagnetic recording disk comprising a 1.2 mm-thick polycarbonate-made disk substrate in a diameter of 130 mm provided with a spiral tracking groove with a width of 0.6 μm, a pitch of 1.6 μm and a depth of 800 Å, and a laminate recording layer including a 900 Å-thick first dielectric film of SiN, a 1000 Å-thick amorphous optomagnetic recording film of Tb—Fe—Co and a 700 Å-thick second dielectric film of SiN successively laminated on the side of the disk substrate having the tracking groove, was prepared by using an in-line type sputtering apparatus for recording film-formation as shown in FIG. 1.

In first and second SiN film-forming chambers 13 and 15 each having an arrangement as illustrated in FIG. 3, four backing plates (totally 8 plates) 32 each having a target-loading surface in a diameter of 20 cm were disposed respectively, and each backing plate 32 was connected to a DC power supply 35. Each DC supply was provided with an arc cut function (i.e., a function of temporarily stopping power-supply at the time of abnormal discharge for protecting the supply and then resuming power supply), and a recorder was further connected to the power supply 35 for recording the occurrence of the arc cutting.

On the back side of each backing plate 32 was disposed a permanent magnet 34 so as to be movable, thereby having the entire sputtering surface of the target function as an erosion region as shown in FIG. 3. Each backing plate 32 was loaded with a target 33 of Si single crystal having a diameter of 20 cm and a thickness of 3 mm. The Si target 33 had been doped with B (boron) to have a specific resistance of $10^{-3}$ Ω.cm at the sputtering surface and the sputtering surface thereof had been conformed to a lattice plane represented by Miller indices (1,0,0) of the Si single crystal.

Then, a substrate holder 17 loaded with 8 disk substrates 21 as shown in FIG. 1 was introduced into a substrate-introducing chamber 11, then conveyed to an evacuation chamber 12 for evacuation and then introduced into the first SiN forming chamber 13, where the first SiN film was formed on the substrate.

The first SiN film formation was performed by first evacuating the inside of the chamber 13 to a vacuum of $1\times10^{-5}$ Pa, introducing Ar gas and $N_2$ gas into the chamber to form an atmosphere of an Ar—$N_2$ mixture gas at a pressure of 0.2 Pa containing 30 vol. % of $N_2$, and effecting the sputtering at a discharge power per $cm^2$ of target area of 5.7 W so as to form the SiN film at a controlled rate of about 260 Å/min while maintaining a distance of 120 mm between the disk substrate 21 and the target 33 within the SiN film forming chamber 13. The first SiN film was formed in about 3 min.

After the first SiN film formation, the substrate was conveyed into the optical recording film-forming chamber 14, wherein the Tb—Fe—Co optomagnetic recording film was formed in a thickness of 1000 Å by RF sputtering free from abnormal discharge and using a sputtering target of $Tb_{23}Fe_{70}Co_7$ in a diameter of 20 mm and a thickness of 3 mm at an Ar gas pressure of 0.1 Pa (established after once evacuated to a vacuum of $1\times10^{-5}$ Pa) and an RF power of 5.6 mW/$cm^2$.

After the Tb—Fe—Co film formation, the substrate was conveyed into the second SiN film-forming chamber 15, wherein the second SiN film was formed in a thickness of 700 Å within about 2.7 min. under the same conditions as the first SiN film formation.

According to the above procedure, 120 substrate holders each loaded with 8 disk substrates were successively introduced and subjected to film formation to obtain a total of 960 optomagnetic disks. The total discharge time of one Si target within the first SiN film forming chamber 13 was 6 hours, and the total discharge time of one Si target within the second SiN film-forming chamber was 5.4 hours.

Figure 12:
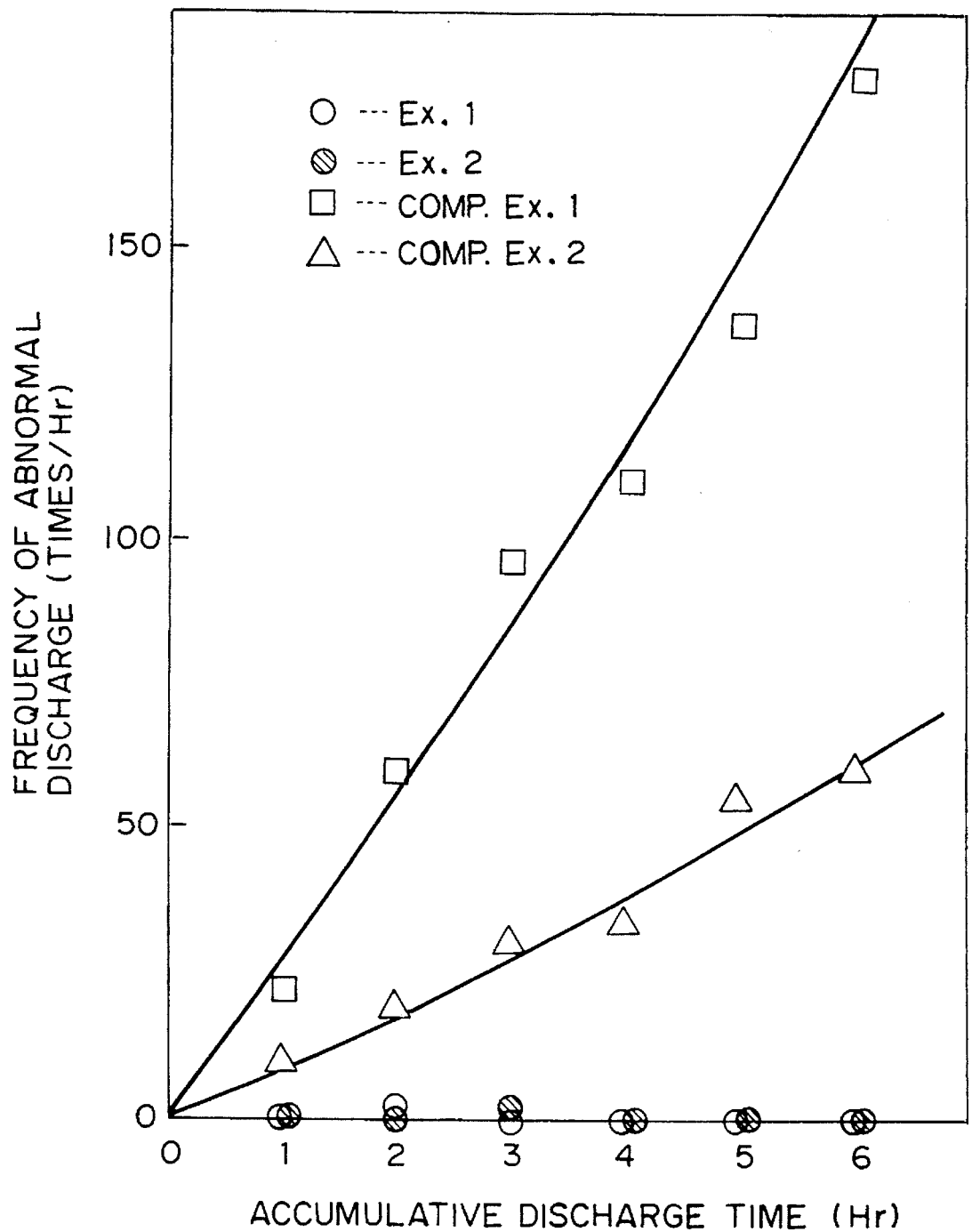
FIG. 12 is a graph showing the frequency of abnormal discharge in Examples 1 and 2, and Comparative Examples 1 and 2 described hereinafter.

Then, the frequency of abnormal discharge for one hour each of the accumulative discharge time for the Si target during the first and second SiN film-forming steps was measured. As a result, almost no abnormal discharge was observed in the first and second film forming steps as shown in FIG. 12.

The 960 optomagnetic disks prepared in this Example were observed through an optical microscope with respect to the state of recording layer calculate a rate of inferior product, based on the standard that each disk was judged as an inferior product if even one pinhole defect in a diameter of at least 50 μm was present. As a result, the rate of inferior product was about 0.5% in this example.

The sputtering surfaces of the four Si targets used in the first SiN film formation were scanned by X-rays for elementary analysis by an X-ray micro-analyzer ("JSM-T200" (trade name), mfd. by Nippon Denshi Datum K.K.), whereby no SiN formation was observed on the sputtering surfaces.

EXAMPLE 2

The Si targets used in Example 1 were replaced by targets of Si single crystal, each having a sputtering surface conforming to a lattice plane represented by Miller indices (1,1,1) and doped to have a specific resistance of 0.001 Ω.cm, and having sizes of 20 cm in diameter and 3 mm in thickness. Optomagnetic disks were prepared otherwise in the same manner as in Example 1.

As a result, almost no abnormal discharge was caused in the first and second SiN forming steps as shown in FIG. 12, and the rate of inferior product was about 0.5%.

As a result of elementary analysis of the sputtering surfaces of the four Si targets used in the first SiN formation in the same manner as in Example 1, no SiN was observed on the sputtering surfaces.

Comparative Example 1

The Si targets used in Example 1 were replaced by targets of Si single crystal, each having a sputtering surface conforming to a lattice plane represented by Miller indices (1,1,0) and doped to have a specific resistance of 0.001 Ω.cm, and having sizes of 20 cm in diameter and 3 mm in thickness. Optomagnetic disks were prepared otherwise in the same manner as in Example 1.

The frequency of abnormal discharge for one hour each of the accumulation discharge time was measured with respect to the four Si targets used in the first SiN film formation, and the average of the four Si targets is shown in FIG. 12. As is clear from FIG. 12, in this Comparative Example 1, the frequency of abnormal discharge remarkably increased as the accumulative discharge time increased, amounting to, e.g., 180 times within one hour of from 5 hours to 6 hours of the accumulative discharge time. This tendency was almost similar in the second SiN forming step.

The rate of inferior products in Comparative Example 1 was about 91%.

Further, as a result of elementary analysis of the sputtering surfaces of the Si targets used in the first SiN film formation in the same manner as in Example 1, SiN was observed in the form of spots on the sputtering surfaces.

Comparative Example 2

The Si targets were replaced by targets of polycrystalline Si with a grain size of 10–15 mm doped to have a specific resistance of 0.001 cm at the sputtering surface. Optomagnetic disks were prepared otherwise in the same manner as in Example 1.

The frequency of abnormal discharge for one hour each of the accumulation discharge time was measured with respect to the four Si targets used in the first SiN film formation, and the average of the four Si targets is shown in FIG. 12. As is clear from FIG. 12, in this Comparative Example 2, the frequency of abnormal discharge remarkably increased as the accumulative discharge time increased, to, e.g., 60 times within one hour of from 5 hours to 6 hours of the accumulative discharge time. This tendency was almost similar in the second SiN forming step.

The rate of inferior products in Comparative Example 2 was about 80%.

Further, as a result of elementary analysis of the sputtering surfaces of the Si targets used in the first SiN film formation in the same manner as in Example 1, SiN was observed in the form of spots on the sputtering surfaces.

EXAMPLE 3

An optomagnetic recording disk comprising a 1.2 mm-thick polycarbonate-made disk substrate in a diameter of 130 mm provided with a spiral tracking groove with a width of 0.6 μm, a pitch of 1.6 μm and a depth of 800 Å, and a laminate recording layer including a 1050 Å -thick first dielectric film of SiN, a 500 Å -thick amorphous optomagnetic recording film of Tb—Fe—Co and a 450 Å -thick second dielectric film of SiN successively laminated on the side of the disk substrate having the tracking groove, was prepared by using an in-line type sputtering apparatus for recording film-formation as shown in FIG. 1.

In first and second SiN film-forming chambers 13 and 15 each having an arrangement similar to the one illustrated in FIG. 3, four backing plates (totally 8 plates) 32 each having a target-loading surface in a diameter of 13.3 cm were disposed respectively, and each backing plate 32 was connected to a DC power supply 35. Each DC supply was provided with the arc cut function, and a recorder was further connected to the power supply 35 for recording the occurrence of the arc cutting.

On the back side of each backing plate 32 was disposed a permanent magnet 34 so as to be movable, thereby having the entire sputtering surface of the target function as an erosion region as shown in FIG 3. Each backing plate 32 was loaded with a target 33 of Si single crystal having a diameter of 13.3 cm and a thickness of 3 mm. The Si target 33 had been doped with B (boron) to have a specific resistance of $10^{-3}$ Ω.cm at the sputtering surface and the sputtering surface thereof had been conformed to a lattice plane represented by Miller indices (1,0,0) of the Si single crystal. Further, the edge adjacent to the sputtering surface of the target were chamfered to provide an angle θ of 45 degrees and a relationship of $a.\sin\theta/h = 1/3$.

Then, a substrate holder 17 loaded with 8 disk substrates 21 as shown in FIG. 1 was introduced into a substrate-introducing chamber 11, then conveyed to an evacuation chamber 12 for evacuation and then introduced into the first SiN forming chamber 13, where the first SiN film was formed on the substrate.

The first SiN film formation was performed by first evacuating the inside of the chamber 13 to a vacuum of $1\times10^{-5}$ Pa, introducing Ar gas and $N_2$ gas into the chamber to form an atmosphere of an Ar—$N_2$ mixture gas at a pressure of 0.2 Pa containing 30 vol. % of $N_2$, and effecting the sputtering at a discharge power per $cm^2$ of target area of 6.5 W so as to form the SiN film at a controlled rate of about 300 Å/min while maintaining a distance of 120 mm between the disk substrate 21 and the target 33 within the SiN film forming chamber 13. The first SiN film was formed in about 3.5 min.

After the first SiN film formation, the substrate was conveyed into the optical recording film-forming chamber 14, wherein the Tb—Fe—Co optomagnetic recording film was formed in a thickness of 500 Å by RF sputtering free from abnormal discharge and using a sputtering target of $Tb_{23}Fe_{70}Co_7$ in a diameter of 20 mm and a thickness of 3 mm at an Ar gas pressure of 0.1 Pa (established after once evacuated to a vacuum of $1\times10^{-5}$ Pa) and an RF power of 5.6 mW/$cm^2$.

After the Tb—Fe—Co film formation, the substrate was conveyed into the second SiN film-forming chamber 15, wherein the second SiN film was formed in a thickness of 450 Å within about 1.5 min. under the same conditions as the first SiN film formation.

According to the above procedure, 120 substrate holders each loaded with 8 disk substrates were successively introduced and subjected to film formation to obtain a total of 960 optomagnetic disks. The total discharge time of one Si target within the first SiN film forming chamber 13 was 7 hours, and the total discharge time of one Si target within the second SiN film-forming chamber was 3 hours.

Figure 13:
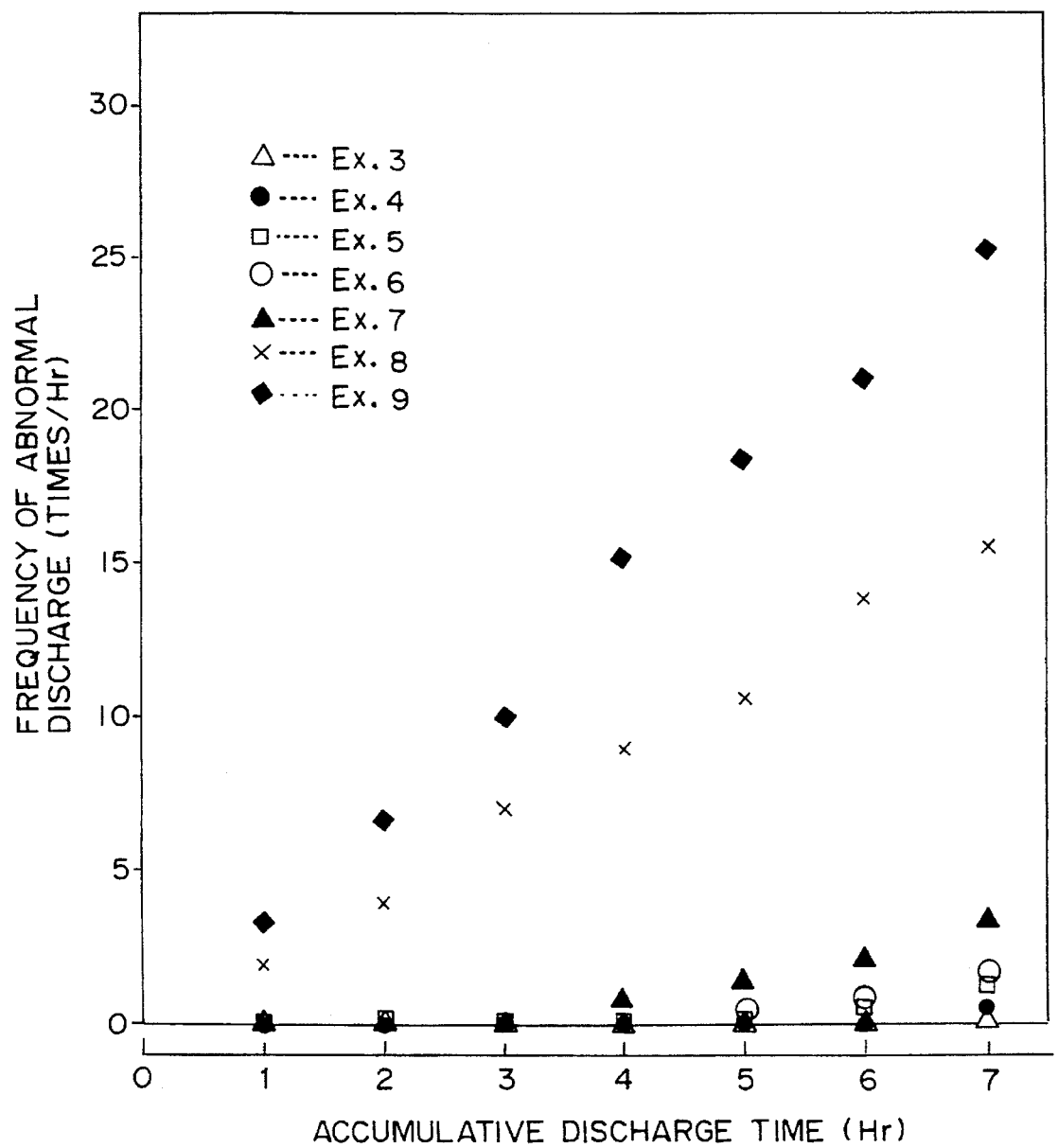
FIG. 13 is a graph showing the frequency of abnormal discharge in Examples 4–10.

Then, the frequency of abnormal discharge for one hour each of the accumulative discharge time for the Si target during the first and second SiN film-forming steps was measured. The frequency of abnormal discharge occurred within the first SiN film forming step is plotted in FIG. 13. As is shown in Figure 13, almost no abnormal discharge was observed in the first film forming step. This tendency was substantially the same as in the second film-forming step.

The 960 optomagnetic disks prepared in this Example were observed through an optical microscope with respect to the state of recording layer calculate a rate of inferior product, based on the standard that each disk was judged as an inferior product if at least one pinhole defect in a diameter of at least 40 μm was present.

The results are summarized in Table 1 appearing hereinafter. The frequency of abnormal discharge shown in Table 1 refer to the frequency observed in the first SiN film-forming step in which the frequency of abnormal discharge was larger than that during the second SiN film-forming step and more specifically the frequency of abnormal discharge observed in one hour from 6–7 hours of the accumulative discharge time for one substrate as an average of the values measured with respect to four targets used in the first film-forming step (i.e., ¼ of the total number of abnormal discharges within one hour).

EXAMPLES 4–9

Optomagnetic disks were prepared in similar manners as in Example 3 by using 6 types of sputtering targets of Si simple crystal respectively having a sputtering surface conforming to a lattice plane represented by Miller indices (1,0,0) but having different edge shapes (chamfering done or not), different diameters and different specific resistances at the sputtering surfaces as shown in Table 1. The shapes of the chamfers provided to the targets in Examples 4–6 were identical to that in Example 3.

The frequency of abnormal discharge, the occurrence of breakage and crack in the targets and the rate of inferior product were evaluated in the same manner as in Example 3. The results are inclusively shown in Table 1.

EXAMPLE 10

An optomagnetic recording disk comprising a 1.2 mm-thick polycarbonate-made disk substrate in a diameter of 130 mm provided with a spiral tracking groove with a width of 0.6 μm, a pitch of 1.6 μm and a depth of 800 Å, and a laminate recording layer including a 900 Å-thick first dielectric film of GeO, a 1000 Å-thick amorphous optomagnetic recording film of Tb—Fe—Co and a 700 Å-thick second dielectric film of GeO successively laminated on the side of the disk substrate having the tracking groove, was prepared by using an in-line type sputtering apparatus for recording film-formation as shown in FIG. 1.

In first and second GeO film-forming chambers 13 and 15 each having an arrangement as illustrated in FIG. 3, four backing plates (totally 8 plates) 32 each having a target-loading surface in a diameter of 20 cm were disposed respectively., and each backing plate 32 was connected to a DC power supply 35. Each DC supply was provided with an arc cut function, and a recorder was further connected to the power supply 35 for recording the occurrence of the arc cutting.

On the back side of each backing plate 32 was disposed a permanent magnet 34 so as to be movable, thereby having the entire sputtering surface of the target function as an erosion region as shown in FIG. 3. Each backing plate 32 was loaded with a target 33 of Ge single crystal having a diameter of 20 cm and a thickness of 3 mm. The Ge target 33 had been doped with B (boron) to have a specific resistance of $10^{-3}$ Ω.cm at the sputtering surface and the sputtering surface thereof had been conformed to a lattice plane represented by Miller indices (1,0,0) of the Ge single crystal.

Then, a substrate holder 17 loaded with 8 disk substrates 21 as shown in FIG. 1 was introduced into a substrate-introducing chamber 11, then conveyed to an evacuation chamber 12 for evacuation and then introduced into the first GeO forming chamber 13, where the first GeO film was formed on the substrate.

The first GeO film formation was performed by first evacuating the inside of the chamber 13 to a vacuum of $1\times10^{-5}$ Pa, introducing Ar gas and $O_2$ gas into the chamber to form an atmosphere of an Ar—$O_2$ mixture gas at a pressure of 0.2 Pa containing 23 vol. % of $O_2$, and effecting the sputtering at a discharge power per $cm^2$ of target area of 5.7 W so as to form the GeO film at a controlled rate of about 170 Å/min while maintaining a distance of 120 mm between the disk substrate 21 and the target 33 within the GeO film forming chamber 13. The first GeO film was formed in about 5.3 min.

TABLE 1

| | Target | | | Target observation | | | | Disk |
| | | | Abnormal | For first film-formation | | For second film-formation | | Rate of inferior |
| Chamfering | Diameter (mm) | Specific resistance (Ω · cm) | discharge Frequency (times/hr) | Breakage | Crack | Breakage | Crack | product (%) |
|---|---|---|---|---|---|---|---|---|
| Ex. 3 done | 133 | $10^{-3}$ | 0.25 | 0 | 0 | 0 | 0 | 0.8 |
| Ex. 4 done | 133 | $10^{-2}$ | 0.50 | 0 | 0 | 0 | 0 | 1.7 |
| Ex. 5 done | 135 | $10^{-3}$ | 1.25 | 0 | 1 | 0 | 0 | 13.3 |
| Ex. 6 done | 135 | $10^{-2}$ | 1.85 | 0 | 1 | 0 | 0 | 15.0 |
| Ex. 7 none | 133 | $10^{-3}$ | 3.25 | 0 | 1 | 0 | 2 | 19.0 |
| Ex. 8 none | 135 | $10^{-3}$ | 15.60 | 3 | 1 | 1 | 1 | 40.0 |
| Ex. 9 none | 135 | $10^{-2}$ | 25.20 | 4 | 0 | 2 | 0 | 45.0 |

After the first GeO film formation, the substrate was conveyed into the optical recording film-forming chamber 14, wherein the Tb—Fe—Co optomagnetic recording film was formed in a thickness of 1000 Å by RF sputtering free from abnormal discharge and using a sputtering target of $Tb_{23}Fe_{70}CO_7$ in a diameter of 20 mm and a thickness of 3 mm at an Ar gas pressure of 0.1 Pa (established after once evacuated to a vacuum of $1\times10^{-5}$ Pa) and an RF power of 5.6 mW/cm².

After the Tb—Fe—Co film formation, the substrate was conveyed into the second GeO film-forming chamber 15, wherein the second GeO film was formed in a thickness of 700 Å within about 4.1 min. under the same conditions as the first GeO film formation.

According to the above procedure, 120 substrate holders each loaded with 8 disk substrates were successively introduced and subjected to film formation to obtain a total of 960 optomagnetic disks. The total discharge time of one Ge target within the first GeO film forming chamber 13 was 10.6 hours, and the total discharge time of one Ge target within the second GeO film-forming chamber was 8.2 hours.

Then, the frequency of abnormal discharge for one hour each of the accumulative discharge time for the Ge target during the first and second GeO film-forming steps was measured. As a result, almost no abnormal discharge was observed in the first and second GeO film-forming steps.

The 960 optomagnetic disks prepared in this Example were observed through an optical microscope with respect to the state of recording layer calculate a rate of inferior product, based on the standard that each disk was judged as an inferior product if at least one pinhole defect in a diameter of at least 50 μm was present. As a result, the rate of inferior product was about 1.5% in this example.

The sputtering surfaces of the four Ge targets used in the first GeO film formation were observed in the same manner as in Example 1, whereby no GeO formation was observed on the sputtering surfaces.

EXAMPLE 11

Optical disks were prepared in the same manner as in Example 1 except that the optical recording film-forming step was replaced by a step of forming a 200 nm-thick layer of a spiropyran compound of the following structural formula (I):

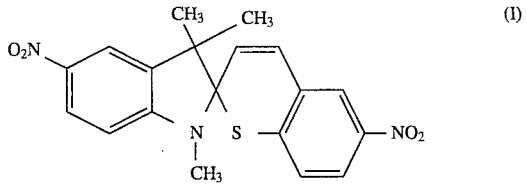

Similarly good results as in Example 1 were obtained. More specifically, optical recording media having a defect-free optical recording layer including the spiropyran film sandwiched with two SiN films were prepared at a good productivity.

Incidentally, the lattice plane on the sputtering surface of Si and Ge single crystal sputtering targets used in Examples and Comparative Examples were identified by X-ray diffraction analysis by using an X-ray diffractometer ("RAD-3B"(trade name), mfd. by Rigaku Denki K.K.). More specifically, a Cu anticathode (target) was used, and Kα rays among. X rays issued therefrom were caused to be incident on the sputtering surface of a sample sputtering target at varying incident angles 2θ ranging from 20–120 degrees to measure and record X-ray diffraction peaks, which were then compared with control data of X-ray diffraction peaks of known substances (from JCDS PF (Joint Committee on Powder Diffraction Standards, Powder Data File)).

What is claimed is:

1. A process for producing an optical recording medium comprising on a substrate an optical recording film and inorganic dielectric film containing a metalloid element, comprising:

an optical recording film-forming step of forming the optical recording film on the substrate, and an inorganic dielectric film-forming step of subjecting at least one sputtering target comprising a crystal of the metalloid element to DC sputtering in a reactive gas atmosphere to form an inorganic dielectric film, wherein said crystal of the metalloid element has a diamond crystal structure, and the sputtering target is so constituted to have a sputtering surface substantially conforming to a lattice plane represented by Miller indices (1,0,0) of the diamond crystal structure.

2. A process according to claim 1, wherein said metalloid element comprises at least one of Si and Ge.

3. A process according to claim 1, wherein the reactive gas comprises at least one member selected from the group consisting of nitrogen, oxygen, ammonia and ethylene.

4. A process according to claim 1, wherein the sputtering target comprises a single crystal.

5. A process according to claim 1, wherein the sputtering surface is planar and the sputtering target has a thickness h, a center point, and a chamfer adjacent the sputtering surface, the chamfer being so configured that a plane passing through the chamfer and the center point, perpendicular to the sputtering surface, defines a line of intersection with the chamfer that has a length a and forms an acute angle Θ with the plane of the sputtering surface, said length and angle satisfying the following relationship:

$$0.2<(a\cdot\sin\Theta)/h<0.8.$$

6. A process according to claim 1, wherein the sputtering target has a sputtering surface which has been made electroconductive by doping with a conductivity-imparting substance.

7. A process according to claim 6, wherein the sputtering surface shows a specific resistance of at most 0.01 Ω.cm.

8. A process according to claim 6, wherein said conductivity-imparting substance comprises at least one of B and P.

9. A sputtering method for forming a film containing a target element comprising at least one of a metal element and a metalloid element, comprising:

providing at least one sputtering target comprising a crystal of the target element, and subjecting the sputtering target to DC sputtering in a reactive gas atmosphere to form an inorganic dielectric film, wherein said crystal of the target element has a diamond crystal structure, and the sputtering target is so constituted to have a sputtering surface substantially conforming to a lattice plane represented by Miller indices (1,0,0) of the diamond crystal structure.

10. A sputtering method according to claim 9, wherein said target element comprises at least one of Si and Ge.

11. A sputtering method according to claim 9, wherein said sputtering target comprises a single crystal.

12. A sputtering method according to claim 9, wherein the reactive gas comprises at least one member selected from the group consisting of nitrogen, oxygen, ammonia and ethylene.

13. A sputtering method according to claim 9, wherein the sputtering surface is planar and the sputtering target has a thickness h, a center point, and a chamfer adjacent the sputtering surface, the chamfer being so configured that a plane passing through the chamfer and the center point, perpendicular to the sputtering surface, defines a line of intersection with the chamfer that has a length a and forms an acute angle $\Theta$ with the plane of the sputtering surface, said length and angle satisfying the following relationship:

$$0.2 \leq (a \cdot \sin \Theta)/h \leq 0.8.$$

14. A sputtering method according to claim 9, wherein the sputtering target has a sputtering surface which has been made electroconductive by doping with a conductivity-imparting substance.

15. A sputtering method according to claim 14, wherein the sputtering surface shows a specific resistance of at most 0.01 $\Omega$.cm.

16. A sputtering method according to claim 14, wherein said conductivity-imparting substance comprises at least one of B and P.

* * * * *

UNITED STATES PATENT AND TRADEMARK OFFICE
CERTIFICATE OF CORRECTION

PATENT NO. : 5,589,040
DATED : December 31, 1996
INVENTOR(S) : NAOKI NISHIMURA

It is certified that error appears in the above-indentified patent and that said Letters Patent is hereby corrected as shown below:

Title page, item
[54] TITLE, and col. 1, line 3,

"MEDIUM" should read --MEDIUM,--.

[56] References Cited

FOREIGN PATENT DOCUMENTS

"3126867   5/1991   Japan" should read
     --3-126867 5/1991   Japan--.

OTHER PUBLICATIONS

"Plasma assisted physcial" should read
   --Plasma assisted physical--.

COLUMN 1

Line 2, "MEDIUM" should read --MEDIUM,--.

UNITED STATES PATENT AND TRADEMARK OFFICE
CERTIFICATE OF CORRECTION

PATENT NO. : 5,589,040          Page 2 of 3
DATED : December 31, 1996
INVENTOR(S) : NAOKI NISHIMURA It is certified that error appears in the above-indentified patent and that said Letters Patent is hereby corrected as shown below:

COLUMN 4

Line 45, "having" should read --being--; and
    Line 60, "having" should read --being--.

COLUMN 5

Line 6, "having" should read --being--.

COLUMN 10

Line 60, "Tb-Fe-Co-b Cr" should read --Tb-Fe-Co-Cr--.

COLUMN 16

Line 17, "respectively.," should read --respectively,--.

UNITED STATES PATENT AND TRADEMARK OFFICE
CERTIFICATE OF CORRECTION

PATENT NO. : 5,589,040        Page 3 of 3
DATED      : December 31, 1996
INVENTOR(S) : NAOKI NISHIMURA It is certified that error appears in the above-indentified patent and that said Letters Patent is hereby corrected as shown below:

<u>COLUMN 17</u>

Line 66, "among." should read --among--.

<u>COLUMN 18</u>

Line 39, "$0.2 < (a \cdot \sin \theta)/h < 0.8$.--should read --$0.2 \leq (a \cdot \sin \theta)/h \leq 0.8$--.

Signed and Sealed this

Twenty-ninth Day of July, 1997

Attest:

BRUCE LEHMAN

Attesting Officer

Commissioner of Patents and Trademarks